United States Patent
Aquilano et al.

(10) Patent No.: US 11,982,716 B2
(45) Date of Patent: May 14, 2024

(54) SELF-CHARACTERIZING SMART CELLS FOR BATTERY LIFECYCLE MANAGEMENT

(71) Applicant: Analog Devices, Inc., Wilmington, MA (US)

(72) Inventors: Gina Aquilano, Somerville, MA (US); Lance Doherty, Somerville, MA (US)

(73) Assignee: Analog Devices, Inc., Wilmington, MA (US)

(*) Notice: Subject to any disclaimer, the term of this patent is extended or adjusted under 35 U.S.C. 154(b) by 0 days.

(21) Appl. No.: 17/461,180

(22) Filed: Aug. 30, 2021

(65) Prior Publication Data

US 2022/0074998 A1 Mar. 10, 2022

Related U.S. Application Data

(60) Provisional application No. 63/074,935, filed on Sep. 4, 2020.

(51) Int. Cl.
*G01R 31/371* (2019.01)
*B60L 58/16* (2019.01)
*G01R 31/382* (2019.01)
*G01R 31/389* (2019.01)
*G01R 31/392* (2019.01)
(Continued)

(52) U.S. Cl.
CPC ............ *G01R 31/371* (2019.01); *B60L 58/16* (2019.02); *G01R 31/382* (2019.01); *G01R 31/389* (2019.01); *G01R 31/392* (2019.01); *H01M 10/4257* (2013.01); *B60L 53/80* (2019.02); *B60L 58/12* (2019.02); *H01M 2010/4271* (2013.01); *H01M 2220/20* (2013.01)

(58) Field of Classification Search
None
See application file for complete search history.

(56) References Cited

U.S. PATENT DOCUMENTS

| 9,267,993 B2 | 2/2016 | Farmer et al. | |
| 2005/0110464 A1* | 5/2005 | Baker | G01R 31/396 320/134 |

(Continued)

FOREIGN PATENT DOCUMENTS

| KR | 20190010032 | 1/2019 |
| WO | 2019187307 | 10/2019 |

(Continued)

OTHER PUBLICATIONS

"International Application Serial No. PCT/US2021/048524, International Search Report dated Dec. 21, 2021", 3 pgs.

(Continued)

*Primary Examiner* — Jas A Sanghera
(74) *Attorney, Agent, or Firm* — Schwegman Lundberg & Woessner, P.A.

(57) ABSTRACT

The battery monitoring techniques described herein use a self-characterizing wireless monitor coupled to a battery to monitor different properties of the battery. The wireless monitor may measure, among other things, an alternating current frequency response (ACFR) of the battery. To accomplish this, the wireless monitor may generate and inject a stimulus signal into the battery, and the monitor may then synchronously measure the corresponding impedance response of the battery.

19 Claims, 6 Drawing Sheets

(51) Int. Cl.
*H01M 10/42* (2006.01)
*B60L 53/80* (2019.01)
*B60L 58/12* (2019.01)

(56) References Cited

U.S. PATENT DOCUMENTS

| | | |
|---|---|---|
| 2006/0170397 A1 | 8/2006 | Srinivasan et al. |
| 2012/0090402 A1 | 4/2012 | Hojo |
| 2012/0326725 A1* | 12/2012 | Sugeno ............. H02J 7/007192 |
| | | 324/429 |
| 2013/0271072 A1 | 10/2013 | Chon et al. |
| 2015/0054518 A1 | 2/2015 | Henrici et al. |
| 2015/0357685 A1* | 12/2015 | Iwasawa ............... G01R 31/371 |
| | | 429/90 |
| 2017/0098872 A1 | 4/2017 | Sood et al. |
| 2017/0254859 A1* | 9/2017 | Christophersen .... G01R 31/382 |
| 2019/0242949 A1* | 8/2019 | Lemkin ................. H01M 10/42 |
| 2022/0074997 A1 | 3/2022 | Aquilano et al. |
| 2022/0190622 A1* | 6/2022 | Kobayashi ........ H02J 7/007182 |
| 2022/0200069 A1* | 6/2022 | Asami ................ G01R 31/3842 |

FOREIGN PATENT DOCUMENTS

| | | |
|---|---|---|
| WO | 2020139747 | 7/2020 |
| WO | 2022051297 | 3/2022 |

OTHER PUBLICATIONS

"International Application Serial No. PCT/US2021/048524, Written Opinion dated Dec. 21, 2021", 6 pgs.
"International Application Serial No. PCT/US2021/048524, International Preliminary Report on Patentability dated Mar. 16, 2023", 8 pgs.

* cited by examiner

SELF-CHARACTERIZING SMART CELLS FOR BATTERY LIFECYCLE MANAGEMENT

CLAIMS OF PRIORITY

This patent application claims the benefit of priority U.S. Provisional Patent Application Ser. No. 63/074,935, titled "MEASURING AC FREQUENCY RESPONSE IN WIRELESS BATTERY MANAGEMENT SYSTEMS/SELF-CHARACTERIZING SMART CELLS FOR BATTERY LIFECYCLE MANAGEMENT," filed on Sep. 4, 2020, which is hereby incorporated by reference herein in its entirety.

TECHNICAL FIELD

The present disclosure generally relates to a wireless Battery Management System (WBMS), in particular battery condition monitoring.

BACKGROUND

Electric cars have been gaining immense popularity. One factor facilitating adoption of electric vehicles has been improvement in battery management. Using a BMS, electric cars may monitor battery levels and communicate that information to a control unit, which in turn can operate the car more reliably and efficiently.

Some BMSs include a wired network (sometimes referred to as a "daisy chain"), where battery monitors are connected to a manager through a wired connection. However, wiring in an electric car comes at a cost and each wire can have its own reliability issue. Consequently, WBMSs have been recently introduced.

Typically, conditions such as voltage and surface temperature can be measured using a BMS. While these conditions can provide an indication of the battery's condition, they do not provide a complete picture of the battery's health. For monitoring other conditions, the battery can be physically connected to complex testing equipment, which is typically done prior to installation. Post-installation, this type of monitoring is cumbersome because the battery must be taken to a testing facility and then taken out of the host device (e.g., electric car) for connecting to the testing equipment.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
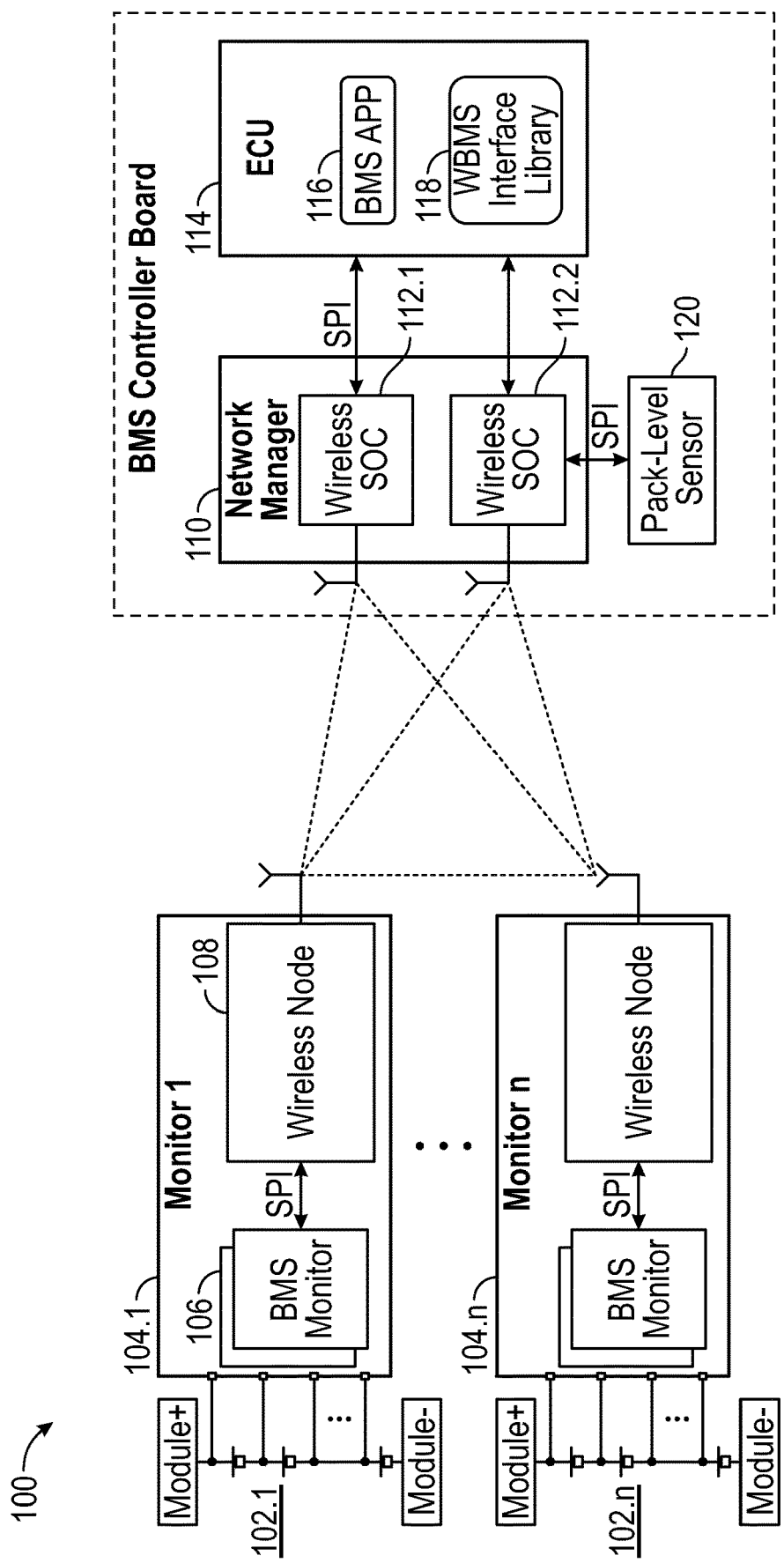
FIG. 1 illustrates a block diagram of a wireless battery management system.

Accordingly, the inventors recognized, among other things, a need for improved and accessible battery monitoring, which can provide more comprehensive information about the condition of the battery. The battery monitoring techniques described herein use a self-characterizing wireless monitor coupled to a battery to monitor different properties of the battery. The wireless monitor may measure, among other things, an alternating current frequency response (ACFR) of the battery (also sometimes referred to as Electrochemical Impedance Spectroscopy (EIS)).

The wireless monitor may generate and inject a stimulus signal into the battery, and the monitor may then synchronously measure the corresponding impedance response of the battery. The stimulus signal may be provided as an alternating current signal with defined frequency properties. The impedance response (e.g., frequency response) of the battery may provide useful data regarding the condition and health of the battery. For example, this data can be used to provide estimates of internal battery temperature, aging characteristics of the battery, and/or advance indications of battery failure.

This document describes a wireless device for monitoring a battery. The wireless device may include a monitor coupled to the battery and configured to generate a stimulus signal, inject the stimulus signal into the battery, and measure a response of the battery to the stimulus signal. The wireless device may also include a wireless node coupled to the monitor and configured to receive the measured response from the monitor and store the measured response in a memory.

This document also describes a method to monitor a battery, the method comprising: generating a stimulus signal within a monitor; injecting the stimulus signal into the battery; measuring a response of the battery to the stimulus signal; and wirelessly transmitting information representative of the measured response to a network manager.

This document further describes a wireless node coupled to a battery monitor. The wireless node includes a memory to store at least one stimulus signal pattern and a processor to execute a testing routine including transmitting an instruction to the battery monitor to inject a stimulus signal pattern based on the at least one stimulus signal pattern. The memory stores measurement data of the battery in response to the stimulus signal from the battery monitor. The wireless node also includes a wireless transceiver to transmit information representative of the measurement data to a network manager.

This document describes a wireless battery management system including a wireless device comprising a monitor coupled to a battery module and configured to measure a response of the battery module to a stimulus signal, wherein the battery module is associated with a unique identifier, and a wireless node coupled to the monitor and configured to receive information about the measured response from the monitor and store the information in a local memory. The wireless battery management system also includes a network manager configured to establish a secure wireless communication connection with the wireless device and to receive the information from the wireless device and an external memory configured to store the information and to associate the information with the unique identifier.

This document also describes a network manager for a battery management system including a wireless unit to communicate with a plurality of monitors, wherein the plurality of monitors are coupled to battery modules associated with unique identifiers. The network manager is configured to transmit instructions to the plurality of monitors to inject respective stimulus signals into the battery modules and measure respective responses of the battery modules; receive from the plurality of monitors information regarding the respective responses; and store the information regarding the respective responses to an external memory location and to associate the information with the unique identifier.

This document further describes method to coordinate monitoring of a battery, the method comprising: transmitting at least one command to a plurality of monitors coupled to respective battery modules each associated with a unique identifier, the at least one command including instructions for each of the plurality monitors to inject a stimulus signal into the battery modules and measure respective responses of the battery modules; receiving from the plurality of monitors information regarding the respective responses; and storing the information regarding the respective responses to an external memory location and associating the information with the unique identifiers.

FIG. 1 illustrates a block diagram of a WBMS 100. The WBMS 100 may include a plurality of battery modules 102.1-102.$n$, each including a plurality of battery cells. For example, the battery modules 102.1-102.$n$ may be lithium ion batteries. Batteries with different specifications, sizes, and shapes may be used. Each module may be coupled to a respective monitor 104.1-104.$n$. The WBMS 100 may also include a network manager 110 and an Electronic Control Unit (ECU)114.

Each monitor 104.1-104.$n$ may include one or more BMS monitors 106 and a wireless node 108. The BMS monitor 106 may be coupled to a battery module and may monitor various conditions or properties of the battery module. The BMS monitor 106 may be provided as an integrated circuit, which can include a monolithically integrated BMS circuit or an integrated module including multiple integrated circuit die or other circuit elements within a commonly-shared integrated circuit device package, as illustrative examples.

The BMS monitor 106 may include a variety of sensors. The BMS monitor 106 may sample the battery voltage to monitor the battery level. The BMS monitor may also monitor current of the battery module and the external surface temperature. In an embodiment, the BMS monitor 106 may include a stimulus signal generator to generate a stimulus signal. The BMS monitor 106 may inject the stimulus signal into the battery module and then monitor the impedance response to the stimulus signal in a synchronous manner. The impedance response may be monitored by measuring the voltage response of the battery to the stimulus signal.

The BMS monitor 106 may be coupled to the wireless node 108 by a communication interface, for example by a Serial Peripheral Interface (SPI) or the like. The BMS monitor 106 and the wireless node 108 may be provided on a single printed circuit board (PCB). The wireless node 108 may include wireless system on chip (SoC), which may include a radio transceiver to communicate the battery measurements to the network manager 110 over a wireless network. In an example, the wireless node 108 may include a Functional Safety (FuSa) central processing unit (CPU) to handle certain battery condition measurements.

The wireless node 108 may include a memory with stored patterns of stimulus signals. For example, a stimulus signal pattern may include a frequency (or set of frequencies), an amplitude value, and a duration to be applied to a sine wave (e.g., a piecewise table of parameters). An example of a pattern may be a frequency of 1 Hz with an amplitude of 1 A for a 10 second duration. The wireless node 108 may instruct the BMS monitor 106 to generate a stimulus signal in accordance with one or more of the stored patterns of stimulus signals. The BMS monitor 106 may then generate the stimulus signal (or a set of stimulus signals) based on the pattern (e.g., frequency, amplitude, duration) and then measure the corresponding response. For example, the stimulus signal generator in the BMS monitor 106 may include a power source with a switch. The power source may then be set to the amplitude value and the switch may be turned on and off to set the frequency value and duration. Examples of stimulus signal generation techniques are described in further detail below.

Moreover, the BMS monitor 106 may change the properties of the stimulus signal (e.g., switch stimulus signal patterns). For example, in a first time interval, the BMS monitor 106 may inject a stimulus signal with a first set of properties (e.g., first signal pattern) and may inject a stimulus signal with a second set of properties (e.g., second signal pattern) in a second time interval and so on. The stimulus signal with the second set of properties may be set based on the measured response of the battery in response to the stimulus signal with the first set of properties.

A plurality of monitors 104.1-104.$n$ may be provided, where each may monitor a separate battery module. Each monitor 104.1-104.$n$ may communicate with the network manager 110 over a wireless network. The wireless network may be provided as a mesh network or the like. The wireless network may be provided using short range wireless communication networks, for example at ~2.4 GHz, using time-synchronous frequency hopping. The network manager 110 may act like a master node and the monitors 104.1-104.$n$ may act like slave nodes. If a monitor 104.1-104.$n$ is released by a network manager 110 or is disconnected, it may search for a new network manager. The wireless network may be a secure network. For example, before the monitor 104.1-104.$n$ communicates with a new network manager, a secure connection may be established by using, for example, a certificate validation.

The network manager 110 may include one or more wireless SOCs 112.1-112.2 to communicate with the Monitors 104.1-104.$n$. The network manager 110 may be coupled to the ECU 114 and a pack-level sensor 120 by respective communication interfaces, for example SPI. The ECU 114 may include a BMS app 116 and WBMS interface library 118 to control operation of the WBMS 100.

Figure 2:
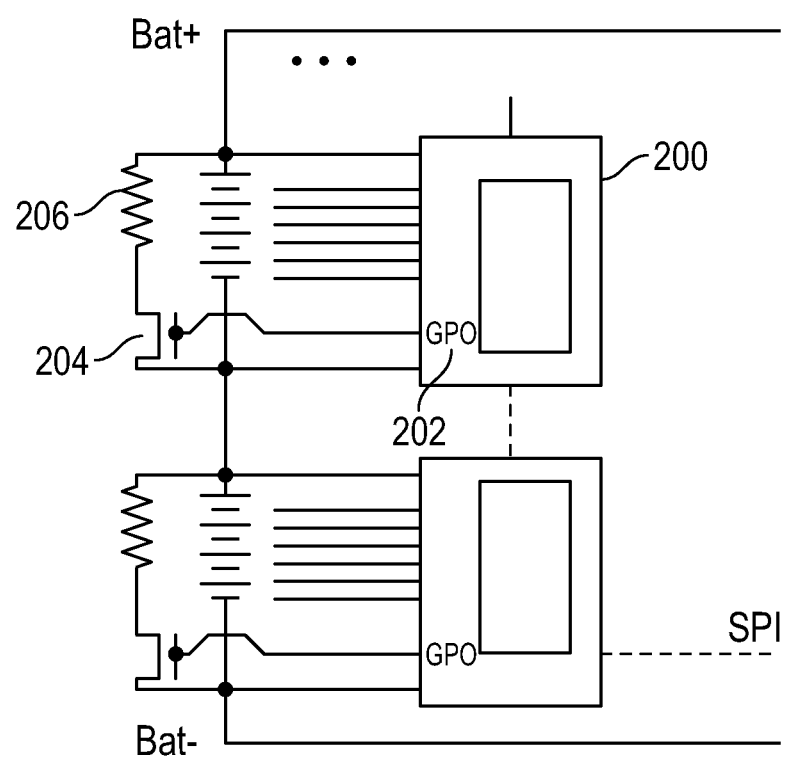
FIG. 2 illustrates example portions of a BMS monitor.

FIG. 2 illustrates example portions of a BMS monitor 200. FIG. 2 illustrates portions of the BMS monitor 200 used to generate and inject a stimulus signal into the coupled battery module. The BMS monitor 200 may include a general-purpose output (GPO) 202, which may be used to generate the stimulus signal. For example, a signal on the GPO 202 may be used to activate a coupled transistor switch 204, creating a stimulus current across a resistor 206, as shown. In one example, the stimulus signal may be approximately ~1-2 A. For example, the signal on the GPO 202 may be a square wave at a single frequency, generating a corresponding stimulus signal at a specified frequency. In another example, the signal on the GPO 202 may be swept to obtain data points from across a frequency spectrum. Further, the signal on the GPO 202 may be provided as a more complex signal such as a pseudo-random pulse train. Voltage of each cell (or module) may be measured and current across the module may also be measured. The measurements may be synchronized with the generation and injection of the stimulus signal.

Figure 3:
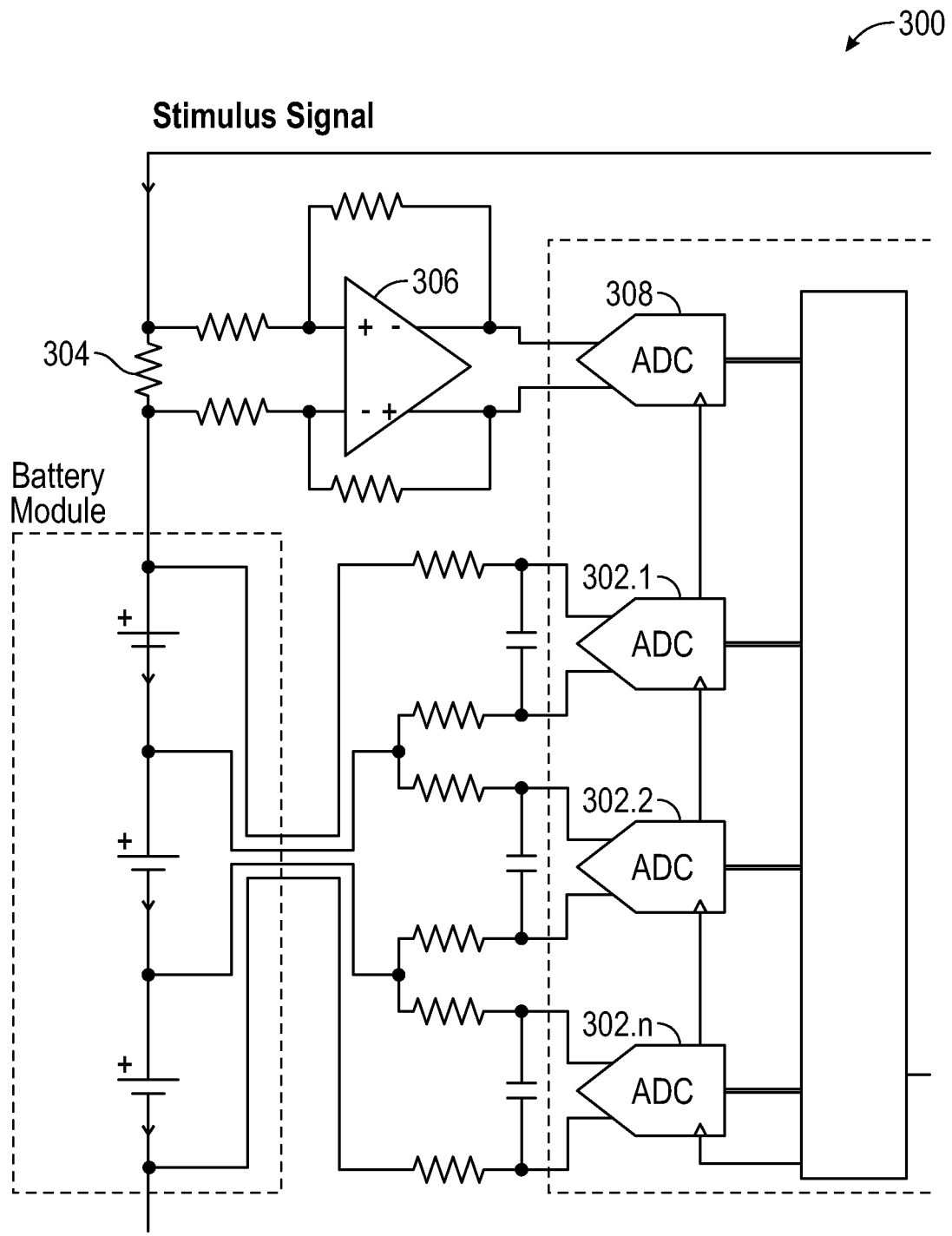
FIG. 3 illustrates example portions of a BMS monitor.

FIG. 3 illustrates example portions of a BMS monitor 300. FIG. 3 illustrates portions of the BMS monitor 300 used to measure a response in the coupled battery module to an injected stimulus signal. The BMS monitor may include a plurality of analog-to-digital converters (ADCs) 302.1-302.n to measure voltage in respective cells of the battery module. The inputs of each of the ADCs 302.1-302.n may be coupled to opposing ends of a respective battery cell.

Current may also be measured. The BMS monitor 300 may include a sense resistor 304, a differential amplifier 306, and another ADC 308. Current across the resistor 304 may be measured using the differential amplifier 306 and the ADC 308. The voltage and current measurements may be synchronized with the generation of the stimulus signal. The measurements may be transmitted to a wireless node for storage and subsequent transmission to a network manager, as described herein.

Figure 4:
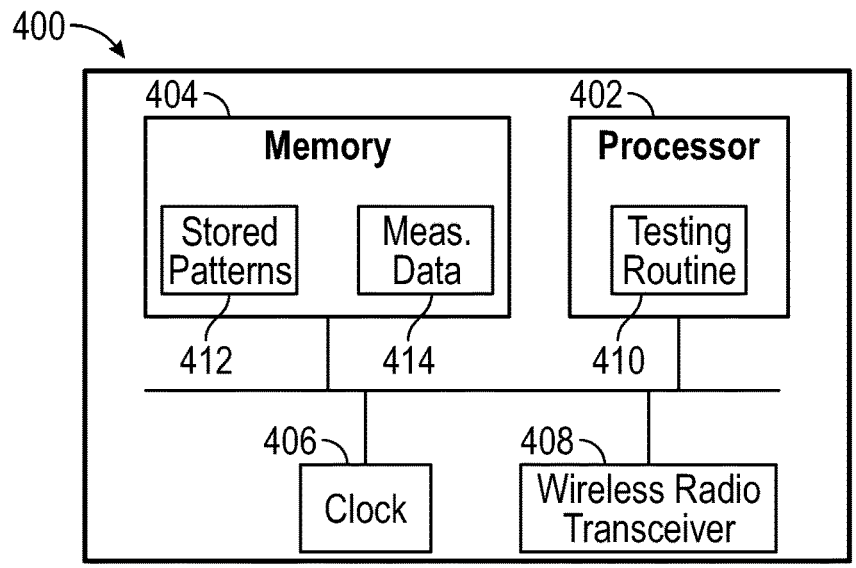
FIG. 4 illustrates example portions of a wireless node.

FIG. 4 illustrates example portions of a wireless node 400. The wireless node 400 may be coupled a BMS monitor, as described herein. The wireless node 400 may include a processor 402, a memory 404, a clock 406, and a wireless radio transceiver 408. The processor 402 may execute a testing routine 410 as described herein. The testing routine 410 may include instructing the coupled BMS monitor to inject a stimulus signal and take synchronous measurements of the battery module (e.g., voltage response, impedance response, current response, phase response, etc.).

The clock 406 may be used for synchronizing the testing, e.g., measuring the voltage response synchronized with the stimulus signal. The clock 406 may be synchronized to a network time set by a network manager.

The memory 408 may store patterns for different stimulus signals (i.e., stored patterns 412) and the received measurement data 414. For example, a stimulus signal pattern may include a frequency (or set of frequencies), an amplitude value, and a duration to be applied to a sine wave (e.g., a piecewise table of parameters). An example of a pattern may be a frequency of 1 Hz with an amplitude of 1 A for a 10 second duration. The stored patterns 412 may be changed or modified. For example, the network manager may send changes to the stimulus patterns or new stimulus patterns to wireless node 400.

The wireless radio transceiver 408 may include components (e.g., antenna, receiver, transmitter, etc.) to communicate with the network manager and/or other wireless nodes using a wireless network. The wireless network may be provided using short range wireless communication networks, for example at ~2.4 GHz, using time-synchronous frequency hopping. In one example, the wireless node 400 may operate as a slave node and the network manager may operate as a master node. If the wireless node 400 is released by or is disconnected to a network manager, the wireless node 400 may search for a new network manager. The wireless network may be a secure network. For example, before wireless node 400 communicates with a new network manager, a secure connection may be established by using, for example, a certificate validation.

In response to a request from a network manager, the wireless node 400 may transmit the stored measurement data 414 to the network manager using the wireless radio transceiver 408. The network manager, in turn, may store the measurement data 414 in a storage location (e.g., cloud storage). Therefore, the measurement data of the battery may be compiled throughout the life of the battery, which may provide useful information about the health and condition of the battery including its usage conditions.

In an example, the wireless node 400 may include a FuSa CPU (e.g., ASIL-D level) to handle the measurement data 414. The FuSa CPU may interpret and filter the measurement data 414 before the wireless node 400 transmits the data to the network manager.

Moreover, the monitors described herein (e.g., monitors 104.1-104.n) may be coupled to a battery module and may be powered by the coupled battery. The network manager, on the other hand, may have a more limited power supply. For example, the network manager may be provided in an electric car and when the car is turned off, it may be powered by a separate starter battery. Thus, the network manager may have more power limitations than the monitors. Accordingly, the monitors may initiate testing of the battery module and may store the data independently.

The monitors may then transmit all or select measurement data to the network manager to reduce the power load on the network manager. In the ACFR context, the monitors may transmit the full impedance values in response to the current stimulus (full impedance v. frequency data). The measurement data may be sent in response to a request by the network manager and may be sent at a specified time to reduce the power load on the network manager. In another example, instead of full impedance values, parametrized summary of impedance values may be transmitted to the network manager. Here, only select parametrized values, such as deviation from normal conditions, may be transmitted instead of the full data set. This may be a form of compressing data.

The monitors, as described herein, may be programmed to take measurements at set intervals (e.g., 10 seconds, 10 minutes, etc.). The monitors may store the results and compare the results to a previously stored data or normal conditions. The monitors may then transmit an alarm to the network manager when the measured conditions deviate from normal conditions or previously stored data. In response to receiving the alarm, the network manager may then send instructions to the monitors to take further actions such as taking additional measurements.

Figure 5:
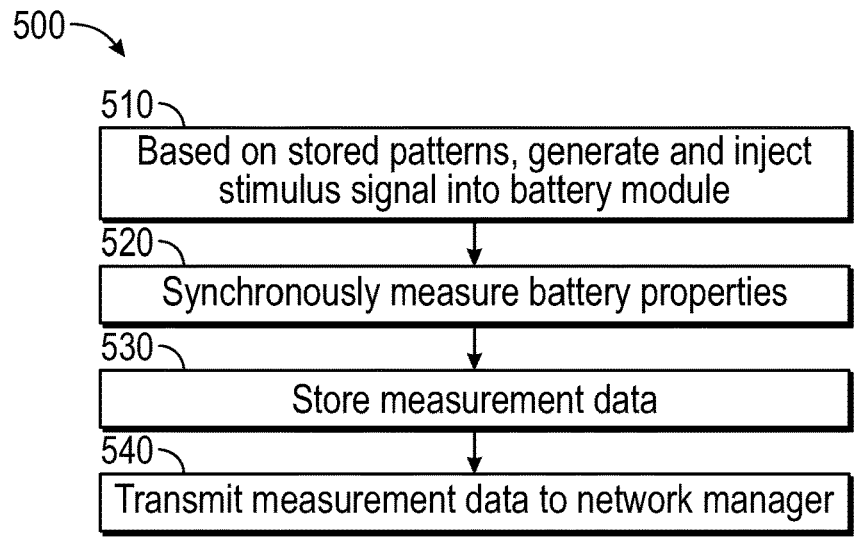
FIG. 5 illustrates a flow diagram for a method for monitoring a battery.

FIG. 5 illustrates a flow diagram for a method 500 for monitoring a battery. The method 500 may be performed by the monitors described herein (e.g., monitors 104.1-104.n). At 510, a stimulus signal may be injected into the battery module. The stimulus signal may be generated based on stored stimulus signal patterns. In an example, the monitor may be programmed to inject the stimulus signal at defined intervals (e.g., 10 seconds, 10 minutes, etc.). In an example, the network manager may transmit an instruction to the monitor to inject the stimulus signal then or at defined intervals.

At 520, different properties of the battery may be measured synchronously with the stimulus signal injection. That is, the battery's response to the stimulus signal may be monitored and measured. For example, voltage, current, phase, impedance, etc., may be monitored. The battery measurements may be performed when the battery is in use by a host device (e.g., electric car) and when the battery is not in use. Because the monitor is coupled to the battery module, the measurements can be taken at any time in a touch-less manner (e.g., without a technician physically attaching testing equipment). The measurement data may include cell-level data for each module, as described herein.

At 530, the measurement data may be stored. In an example, the measurement data may be compressed before storing. As described above, steps 510-530 may be performed multiple times. For example, steps 510-530 may be performed in an iterative manner with each iteration using a different signal pattern and each the signal pattern for each iteration may be based on the measured response of the previous iteration.

At 540, the stored measurement data may be transmitted to a network manager. As described herein, all or select portions of the measurement data may be transmitted to the network manager.

In an example, a battery may be associated with a unique identifier and the measurement data for the battery may be tracked based on the unique identifier even as the battery moves from one host device to another. For example, the battery may be removed from an electric vehicle (e.g., after its capacity has deteriorated beyond 80%) and then sent to a refurbishment center. At the refurbishment center, a network manager may connect wirelessly to the monitor coupled to the battery and may then have access to the measurements of that battery throughout its life via the memory in the monitor and/or an external storage location where the measurement data is stored. The unique identifier may be unique among currently active batteries. For example, once a battery is retired, the identifier for that battery may be re-assigned to another battery and that identifier may become the unique identifier for that new battery.

Battery modules of a battery may also be associated with unique identifiers and the measurement data for the battery modules may be tracked based on their respective unique identifiers. A monitor may reside with a battery module for the lifetime of that battery module. In the event a battery module is disassembled from other modules in the larger battery pack, each battery module may be tracked based on its unique identifier. Hence, the history of each battery module may be stored and be available for comparison for monitoring the performance of each respective battery module as compared to its historical performance. This may be used to determine the quality of each battery module as they may be repurposed throughout their lifetime.

Figure 6:
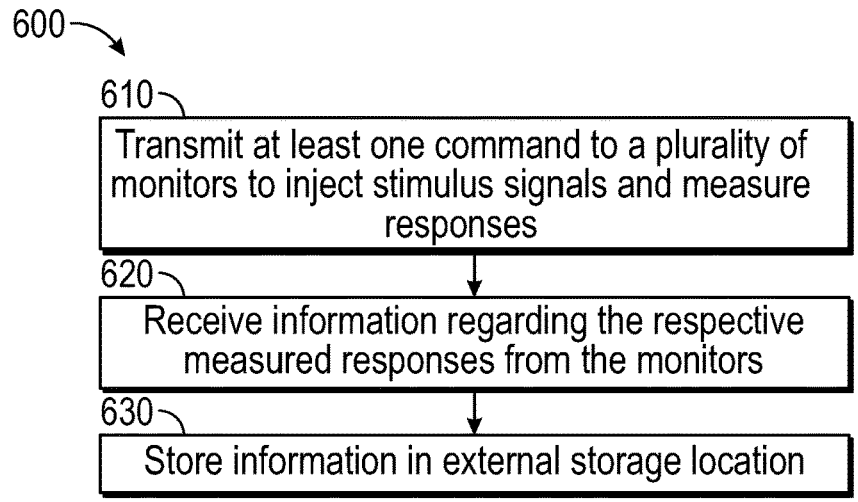
FIG. 6 illustrates a flow diagram for a method for coordinating battery monitoring.

FIG. 6 illustrates a flow diagram for a method 600 for coordinating battery monitoring. The method 600 may be performed by the network managers described herein (e.g., network manager 110). At 610, the network manager may transmit at least one command to a plurality of monitors coupled to battery modules as described herein. The battery modules may be associated with unique identifiers, as described herein. The command may include instructions for each of the monitors to generate a stimulus signal therein, to inject the generated stimulus signal, and to measure a response of the respective battery module to the stimulus signal. The instructions may instruct the monitors to generate synchronized stimulus signals for the respective modules. The instructions may include information related to stored stimulus signal patterns. The instructions may instruct the monitors to synchronously measure the responses to the stimulus signals. In response to the instruction, the monitors may execute the instructions, as described herein, and may transmit information regarding the respective responses to the network manager.

At 620, the network manager may receive information regarding the respective measured responses from the monitors. At 630, the network manager may store the information regarding the respective responses to an external storage location. The stored information may be associated with the unique identifiers of the battery modules (and/or the battery). Thus, information regarding the battery modules may be tracked through the lifecycle of the battery independent of the host device.

Figure 7A:
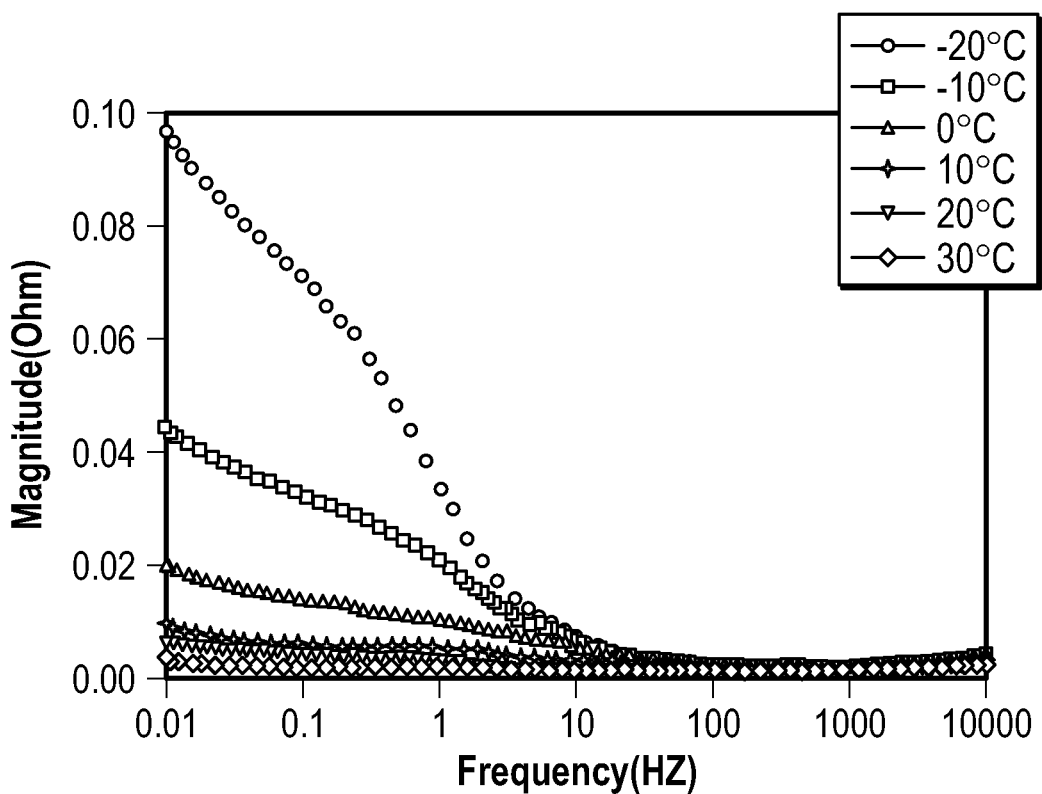
FIGS. 7A-7D are example graphs illustrating frequency responses.
Figure 7B:
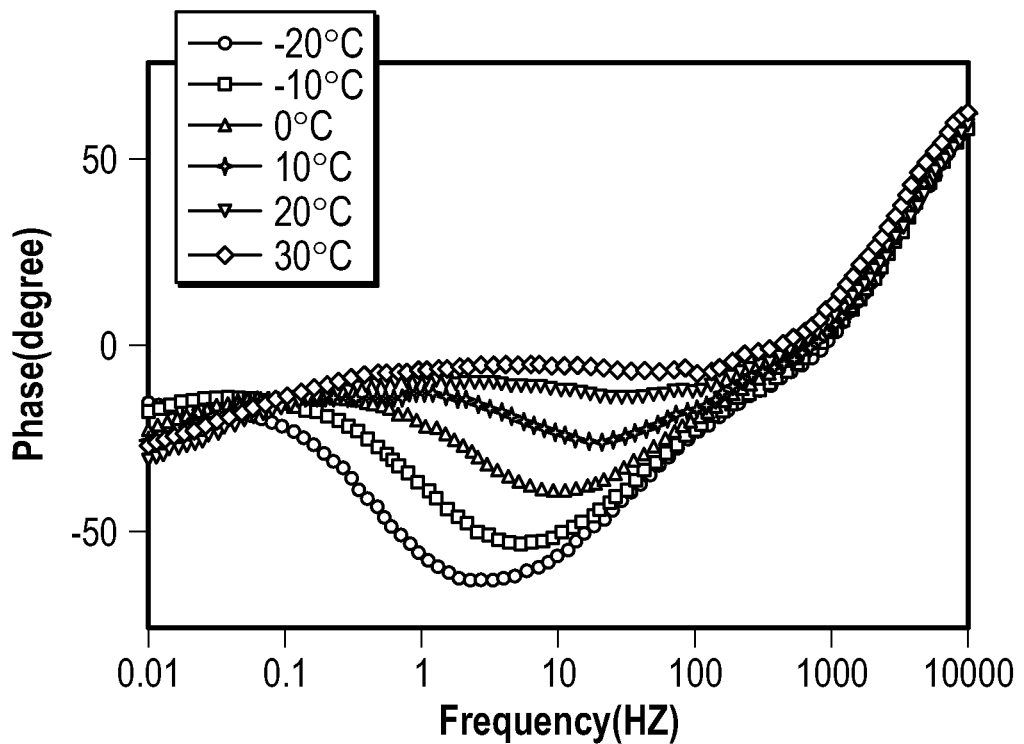
Figure 7C:
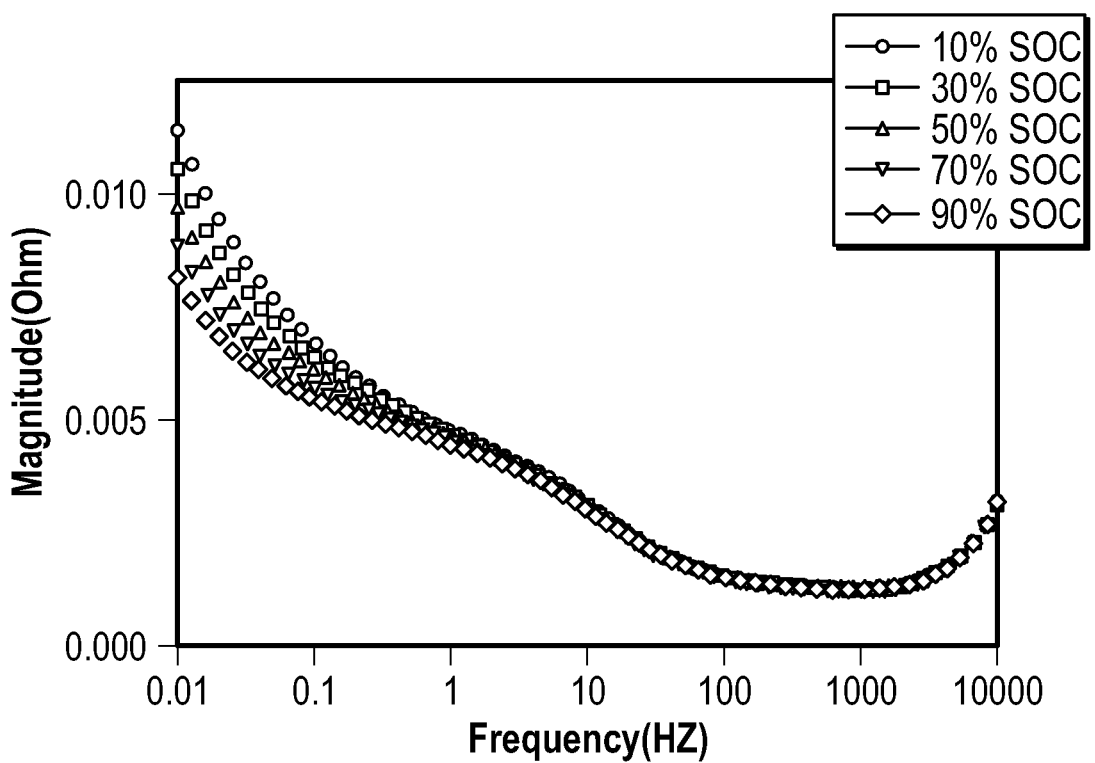
Figure 7D:
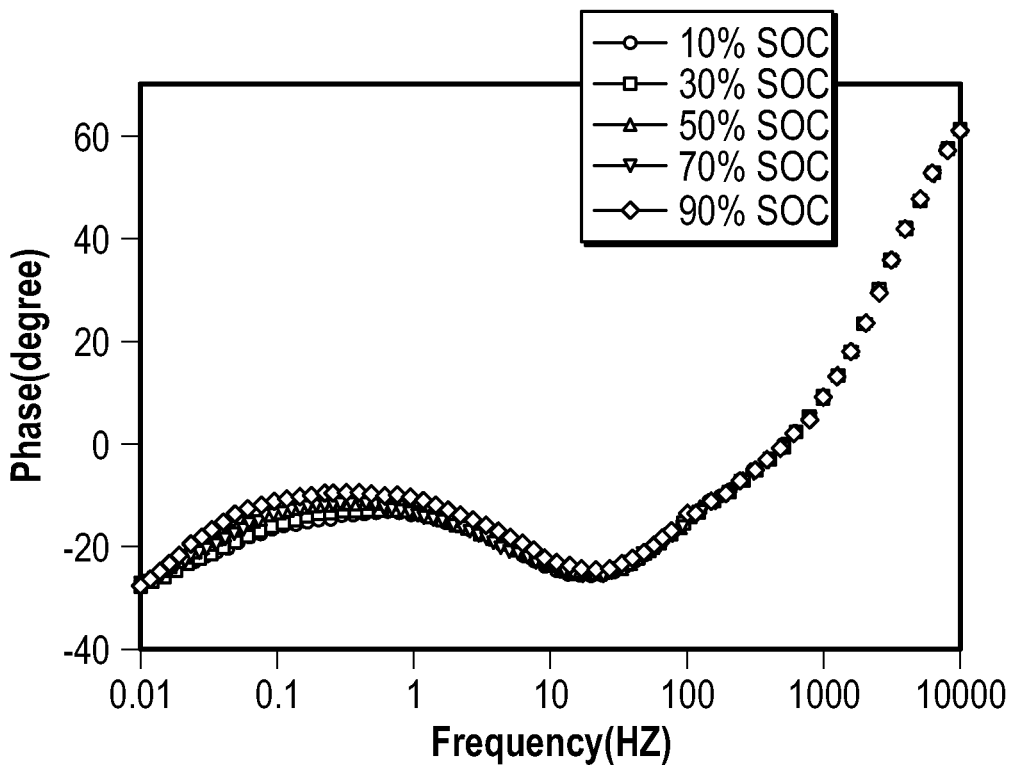

The measurement data described herein (e.g., ACFR data) may provide valuable insight into the condition of the battery. FIGS. 7A-7D illustrates example Bode plots of impedance vs. frequency based on captured frequency responses. FIGS. 7A and 7B show the measured battery impedance versus frequency over battery core temperature in terms of magnitude and phase, respectively. The impedance shifts at certain frequency ranges may directly correlate to the internal temperature of the battery. FIGS. 7C and 7D show the measured battery impedance versus frequency over state of charge in terms of magnitude and phase, respectively. The impedance shifts at certain frequency ranges may directly to correlate to the state of charge of the battery. These are examples of insights that can be determined due to the correlation of the impedance to these types of parameters.

The ACFR data may be used to determine the internal battery temperature. Standalone temperature sensors, in contrast, typically can measure surface or external temperature of a battery. The core or internal temperature obtained from the ACFR data may provide a faster indicator of the battery's condition (e.g., over heating) than the surface temperature.

The ACFR data may also provide insight into the aging characteristics of the battery. A battery may age different depending on a variety of factors, such as usage and charging conditions. The ACFR data (e.g., impedance measurements) may provide information into how the battery is aging. The measurement data described herein may therefore provide continuous feedback on battery health. This information may be then used to accommodate for asymmetries in battery health by balancing energy use by different modules, limiting system output when battery health is degrading, changing under/overcharge conditions as the battery changes to obtain optimal battery range, etc.

Furthermore, the ACFR data may be used to detect anomalies in advance of battery failure (e.g., impending failure warning). For example, the measurement data can be used to trigger an alarm for a driver of an electric vehicle indicating the battery is need of servicing.

In an example, the measurement data (e.g., ACFR data) may be obtained in response to the natural stimulus of the battery when it is in use (e.g., by an electric vehicle) rather than an injected stimulus signal. For example, a natural stimulus signal (e.g., a current) may be generated external to the monitor such as when an electric vehicle accelerates drawing more current from the battery. A current monitor may measure the natural stimulus and then synchronize measurement of the voltage/impedance response accordingly. Noise from other components may be filtered to improve the signal-to-noise ratio of the measurement data.

As described herein, the monitors may be provided as a self-characterizing smart components used to monitor battery condition throughout the battery's life independent of the host device using the battery. For example, a monitor, as described herein, may be installed after manufacturing (e.g., cell formation) or module assembly. As described herein, the monitor may then be able to characterize the battery's condition using, for example, current stimulus that can be generated within the monitor itself. The measurement data may be stored in the monitor and then communicated to a network manager regardless of the type of host device and may be used to self-characterize the health of the battery.

When the monitor is coupled to a network manager, such as when it is installed in an electric car, it may communicate the stored measurement data to the network manager, which, in turn, may store the data in a storage location such as a cloud storage location.

The monitor may be capable of communicating with different network managers depending on its use. For example, before installation in an electric vehicle, a monitor may communicate with a network manager associated with an assembly plant (e.g., battery or vehicle assembly plant). Upon installation in an electric vehicle, a monitor may communicate with a network manager associated with the vehicle. After the battery has been removed from that vehicle and is located elsewhere (e.g., refurbishment center, another vehicle, home generator, etc.), the monitor may communicate with a different network manager associated with the new location. Thus, the monitor may be able to monitor the condition of the battery independent of its host device, location, or the network manager. Moreover, the monitor may communicate its independently obtained data to different network managers (e.g., in a manufacturing facility, car, solar system, wind system, refurbishment plant, etc.).

The self-characterizing monitoring techniques described herein may provide a low (or no) touch characterization technique that provides more comprehensive data because it can monitor the battery more frequently as compared to using testing equipment at a testing facility requiring a physical connection. The self-characterizing monitoring techniques may also save significant time in testing as testing can be done independently and may provide instant access to the battery's current condition. This allows the analysis of the battery at any time throughout the lifecycle of the battery. The full history of the battery's health may be stored in the memory in the monitor and/or external storage location and may be accessible without physically connecting to the battery. Thus, the battery's health may be traceable for its life cycle.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

The invention claimed is:

1. A wireless device for monitoring a battery, comprising:
a monitor coupled to the battery and configured to generate a stimulus signal and inject the stimulus signal into the battery, the monitor including a plurality of analog-to-digital converters to measure a response from respective cells of the battery to the stimulus signal, wherein the stimulus signal includes an alternating current waveform across a frequency spectrum; and
a wireless node coupled to the monitor and configured to receive the measured responses from the monitor, compress the responses from the respective cells, and store the responses in a memory, the wireless node configured to determine an internal temperature of the battery based on the measured responses including impedance shifts at specified frequency ranges of the frequency spectrum.

2. The wireless device of claim 1, wherein the wireless node is further configured to store a stimulus signal pattern and to instruct the monitor to generate the stimulus signal based on the stimulus signal pattern.

3. The wireless device of claim 2, wherein the stimulus signal pattern includes one or more of a frequency, amplitude, or duration parameter.

4. The wireless device of claim 1, wherein the wireless node includes a wireless transceiver to transmit the stored response to a network manager.

5. The wireless device as claim 4, wherein the wireless node is further configured to transmit the stored response to the network manager in response to receiving a request from the network manager.

6. The wireless device of claim 1, wherein the wireless node is further configured to communicate with different network managers.

7. The wireless device of claim 1, wherein the response includes an impedance response to the stimulus signal.

8. The wireless device of claim 1, wherein the plurality of analog-to-digital converters are configured to measure voltage responses from respective cells of the battery.

9. The wireless device of claim 1, wherein at least one analog-to-digital converter of the plurality of analog-to-digital converters is configured to measure a current response of the battery.

10. The wireless device of claim 1, further comprising:
a functional safety processor to filter the measured response, wherein the filtered measured response is transmitted to a network manager.

11. The wireless device of claim 1, wherein the monitor is configured to synchronously measure the response with respect to the stimulus signal.

12. The wireless device of claim 1, wherein the monitor is configured to measure a voltage response and a current originating external to the monitor when the battery is in use without the stimulus signal.

13. A method to monitor a battery, the method comprising:
generating a stimulus signal within a monitor;
injecting the stimulus signal into the battery, wherein the stimulus signal includes an alternating current waveform across a frequency spectrum;
measuring responses from respective cells of the battery to the stimulus signal;
compressing the measured responses;
wirelessly transmitting information representative of the measured responses to a network manager; and
determining an internal temperature of the battery based on the measured responses including impedance shifts at specified frequency ranges of the frequency spectrum.

14. The method of claim 13, wherein the stimulus signal is generated based on a stored stimulus signal pattern.

15. The method of claim 14, wherein the stored stimulus signal pattern includes one or more of a frequency, amplitude, or duration parameter.

16. The method of claim 15, wherein the response is measured synchronously with respect the stimulus signal.

17. A wireless node coupled to a battery monitor, the wireless node comprising:
a memory to store at least one stimulus signal pattern;
a processor to execute a testing routine including transmitting an instruction to the battery monitor to inject a stimulus signal based on the at least one stimulus signal pattern, wherein the stimulus signal includes an alternating current waveform across a frequency spectrum, and to compress measurement data from respective cells of the battery and to determine an internal temperature of the battery based on the measured responses including impedance shifts at specified frequency ranges of the frequency spectrum; and
a wireless transceiver to transmit information representative of the compressed measurement data to a network manager.

18. The wireless node of claim 17, wherein the stimulus signal pattern includes one or more of a frequency, amplitude, or duration parameter.

19. The wireless node of claim 17, wherein the measurement data is measured synchronously with respect the stimulus signal.

* * * * *